(12) United States Patent
Mai et al.

(10) Patent No.: US 11,979,151 B2
(45) Date of Patent: May 7, 2024

(54) INTEGRATED CIRCUIT (IC) HAVING AN ANALOG MULTIPLEXER (MUX)

(71) Applicant: NXP USA, Inc., Austin, TX (US)

(72) Inventors: Khoi Mai, Austin, TX (US); Michael Todd Berens, Austin, TX (US); Andre Luis Vilas Boas, SP (BR); Felipe Ricardo Clayton, SP (BR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/933,634

(22) Filed: Sep. 20, 2022

(65) Prior Publication Data

US 2024/0097686 A1    Mar. 21, 2024

(51) Int. Cl.
| | | |
|---|---|---|
| *H03K 17/693* | (2006.01) | |
| *H03K 17/081* | (2006.01) | |
| *H03K 19/173* | (2006.01) | |
| *H03K 19/17784* | (2020.01) | |
| *H03M 1/12* | (2006.01) | |

(52) U.S. Cl.
CPC ... *H03K 19/1737* (2013.01); *H03K 17/08104* (2013.01); *H03K 19/17784* (2013.01); *H03M 1/1205* (2013.01)

(58) Field of Classification Search
CPC ......... H03K 17/08104; H03K 19/1737; H03K 19/17784; H03M 1/1205
See application file for complete search history.

(56) References Cited

U.S. PATENT DOCUMENTS

| | | |
|---|---|---|
| 9,484,905 B1 | 11/2016 | Mai et al. |
| 10,295,572 B1 | 5/2019 | Mai et al. |
| 2003/0016070 A1 | 1/2003 | Yang |
| 2012/0218133 A1* | 8/2012 | Thirunakkarasu ... H03K 17/693 327/408 |
| 2013/0222163 A1 | 8/2013 | Darthenay |

(Continued)

FOREIGN PATENT DOCUMENTS

| | | |
|---|---|---|
| CN | 103997326 A | 8/2014 |
| CN | 107241088 A | 10/2017 |

OTHER PUBLICATIONS

Berens et al.: "A General Purpose 1.8-V 12-b 4-MS/s Fully Differential SAR ADC With 7.2-Vpp Input Range in 28-nm FDSOI", IEEE Transactions On Circuits and Systems II:, vol. 66, No. 11, Nov. 1, 2019 (Nov. 1, 2019), pp. 1785-1789, ISSN: 1549-7747, Express Briefs, IEEE, USA.

*Primary Examiner* — Kurtis R Bahr
(74) *Attorney, Agent, or Firm* — Joanna G. Geld

(57) ABSTRACT

An integrated circuit includes a plurality of analog inputs, and an analog multiplexer (MUX). The MUX includes a common output node configured to provide a MUX output, a plurality of analog switches, and a shared buffer. Each switch includes a corresponding bootstrap circuit coupled to a control electrode of a corresponding pass transistor in which the corresponding bootstrap circuit includes a corresponding boosting capacitor. Each analog switch of the plurality of analog switches has a first input coupled to a corresponding analog input of the plurality of analog inputs, a second input, and an output coupled to the common output node. The shared buffer has an input coupled to the common output node and coupled to provide a common buffered MUX output to the second input of each of the plurality of analog switches.

20 Claims, 6 Drawing Sheets

(56) References Cited

U.S. PATENT DOCUMENTS

| | | | |
|---|---|---|---|
| 2018/0050200 A1* | 2/2018 | Wasserman | A61N 1/40 |
| 2018/0102180 A1 | 4/2018 | Meacham | |
| 2018/0219517 A1* | 8/2018 | Nagatani | H03K 17/62 |
| 2022/0271764 A1* | 8/2022 | K | H03M 1/1057 |

* cited by examiner

INTEGRATED CIRCUIT (IC) HAVING AN ANALOG MULTIPLEXER (MUX)

BACKGROUND

Field

This disclosure relates generally to integrated circuits, and more specifically, to an integrated circuit including an analog multiplexer (MUX).

Related Art

In many analog applications, it is desired to have multiple analog input signals share one resource. In such applications, an analog multiplexer (MUX) allows for a selected one of the multiple analog input signals to be connected to a common output of the analog MUX. For example, an analog MUX may include multiple analog switches, each connected between a corresponding analog input and the common output. In one example, an analog MUX can be used to select between different voltages to provide to an analog-to-digital converter (ADC). Each analog switch of an analog MUX typically uses a bootstrap circuit to improve linearity by maintaining a fairly constant gate-to-source voltage (Vgs) on the pass transistor of the analog switch. However, if the bootstrap circuit receives the selected input voltage directly, it adds unwanted parasitics and leakage. For this reason, each analog switch may include a buffer so as to provide a buffered version of the input voltage to the bootstrap circuit. This is a problem, though, when input voltages need to be greater than the voltage rating of the transistors. As the technologies become more advanced and no longer support devices capable of the required input voltages, the buffer design becomes increasingly large and complex due to the required overvoltage protection. Moreover, having a buffer for each input of the analog MUX is costly in area and may therefore limit the number of feasible inputs in a particular design. Therefore, a need exists for an improved analog MUX configuration capable of handling the required input voltages while maintaining linearity and without overly increasing the circuit area required by the analog MUX.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an analog MUX includes multiple analog inputs and a common MUX output. A corresponding analog switch having one or more corresponding pass transistors is coupled between each analog input and the common MUX output. For each analog switch, a corresponding bootstrap circuit is coupled to the gates of the one or more corresponding pass transistors. The common MUX output is coupled to an input of a common buffer shared by all of the analog switches, in which an output of the common buffer tracks the output of the analog MUX, thus providing a buffered MUX output. The buffered MUX output is fed back to the corresponding bootstrap circuit of each of the analog switches. In this manner, the buffered MUX output is coupled as an input to each corresponding bootstrap circuit while the analog input is provided as an input to the one or more corresponding pass transistors but not to the corresponding bootstrap circuit. Through the use of the common buffer, area savings can be achieved as compared to having a buffer at each input, while addressing the challenge of overvoltage inputs (the ability to handle input voltages which are greater than, e.g. twice, the supply voltage).

Figure 1:
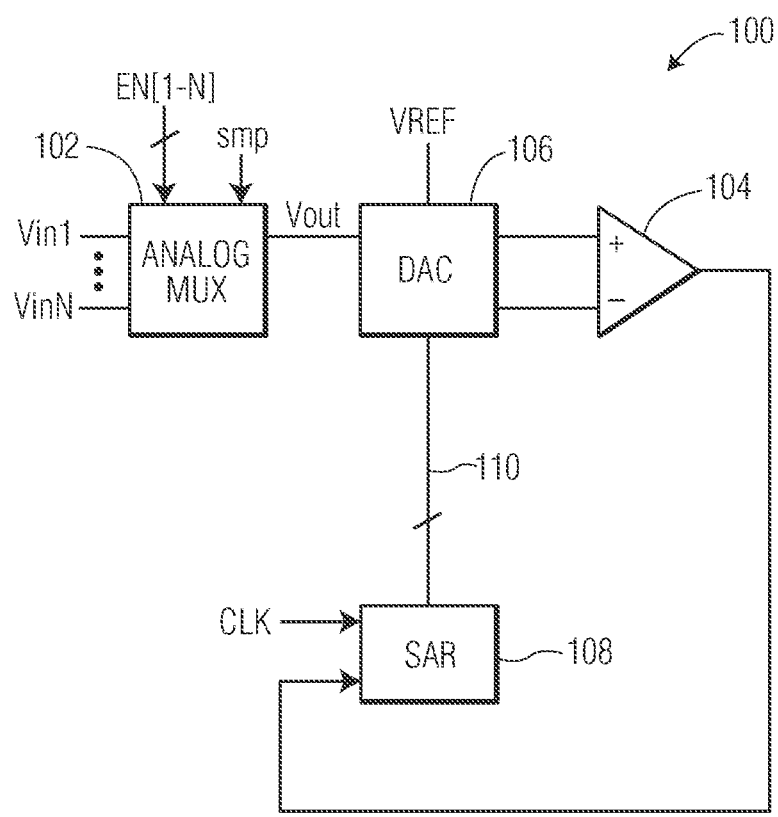
FIG. 1 illustrates, in block diagram form, an analog-to-digital converter (ADC) including a digital to analog converter (DAC) and an analog MUX, in accordance with one embodiment of the present invention.

FIG. 1 illustrates an ADC 100 including a digital to analog converter (DAC) 106, an analog MUX 102, a comparator 104, and a successive approximation register (SAR) 108, in accordance with one embodiment of the present invention. ADC 100 is implemented as a SAR ADC which receives an analog voltage, Vout from MUX 102, as its analog input and provides the resulting digital code in SAR 108 as the corresponding converted digital output. SAR ADC operates to perform each conversion by implementing a sample phase and a subsequent approximation (i.e. comparison) phase. ADC 100 can be formed on an integrated circuit (IC) with analog MUX 102. In one embodiment, ADC 100 and analog MUX 102 are implemented as part of a system-on-a-chip (SoC).

In the illustrated embodiment, analog MUX 102 (also referred to simply as MUX 102) includes N inputs to receive N input voltages, Vin1–VinN. Analog MUX 102 also receives N enable signals, EN[1–N], to select one of Vin1–VinN for use in providing Vout by enabling the corresponding analog switch of MUX 102. EN can include any number of bits, as needed, to select one of the N input voltages. In the illustrated embodiment, EN is an N-bit value, but may include fewer bits which are decoded to select one of the N input voltages. Note that the inputs are one-hot such that only one input voltage can be selected by EN[1–N] to generate Vout. Analog MUX 102 also receives a sample signal (smp), which may also be referred to as a sample control signal. As will be described in more detail below, smp is a digital signal that toggles between a logic level high and a logic level low, and used to distinguish between a sample phase and a non-sample phase. In one embodiment, the smp signal has a periodic waveform, such as, e.g., a clock signal. In some applications, such as in uses with an ADC, the non-sample phase may be an approximation phase (i.e. comparison phase) of operation. Also during the non-sample phases, pre-charge operations may be performed within analog MUX 102. In the illustrated embodiment, analog MUX 102 can also be referred to as a voltage sampling switch circuit which samples the selected input voltage. Note that any of Vin1–VinN may exceed the voltage rating for at least some transistors in analog MUX 102 and DAC 106. Further details of analog MUX 102 will be provided below.

Still referring to FIG. 1, the SAR ADC which receives the analog input voltage (Vout from analog MUX 102) and includes DAC 106, SAR 108, and comparator 104 can be implemented as known in the art. Since SAR ADCs are known in the art, operation of the SAR ADC of FIG. 1 will only be briefly discussed. DAC 106 is coupled to receive Vout from analog MUX 102, a reference voltage VREF, a digital value from SAR 108, and is coupled to the first and second inputs of comparator 104 (in which one input corresponds to a non-inverting input and the other to an inverting input). As known in the art, DAC 106 typically includes a DAC array (e.g., a charge distribution array implemented using capacitive elements or resistive elements or a combination of capacitor and resistive elements) coupled to the first input of comparator 104. In the case of a single-ended DAC, VREF can be created by a dummy DAC array which is coupled to the second input of comparator 104. For a differential DAC, a duplicated DAC array, identical to the DAC array, can be coupled to the second input of comparator 104.

In operation, DAC 106 converts a digital value (stored on its DAC array) to a corresponding analog signal (provided as its output to the first input of comparator 104). During the sample phase, DAC 106 samples the analog input voltage to ADC 100 (corresponding to Vout from analog MUX 102) onto the DAC array. Also during the sample phase, while Vout is being sampled, elements of ADC 100 can be precharged as needed (e.g. the inputs of comparator 104 are precharged to a common mode voltage). During the subsequent approximation phase of DAC 106 (also referred to as the comparison phase), the DAC array is controlled by the digital value from SAR 108 to successively approximate the input voltage using the output of comparator 104 to make decisions on how to switch the elements of the DAC array. During iterations of the approximation phase, the output of comparator 104 results in a next bit being stored in SAR 108. At the end of the approximation phase, the conversion is complete and the resulting digital code in SAR 108 is provided as the output of ADC 100, which corresponds to the digital representation of the analog input voltage (i.e. Vout from MUX 102).

In the illustrated embodiment, the output of analog MUX 102 is provided to circuitry of a SAR ADC. However, in other embodiments, analog MUX 102 can be used with different types of circuitry which need to receive a selected analog input from a plurality of analog inputs. For example, analog MUX 102 can be used in different types of ADCs (e.g. flash ADCs, sigma-delta ADCs, etc.), in data converters, sensors, and other analog or processing devices. Also, in one embodiment, the enable signals (e.g. EN[1-7]) can be asserted, one at a time, to sample each of the N input voltages in turn. For example, each input voltage may correspond to an output of a particular sensor.

Figure 2:
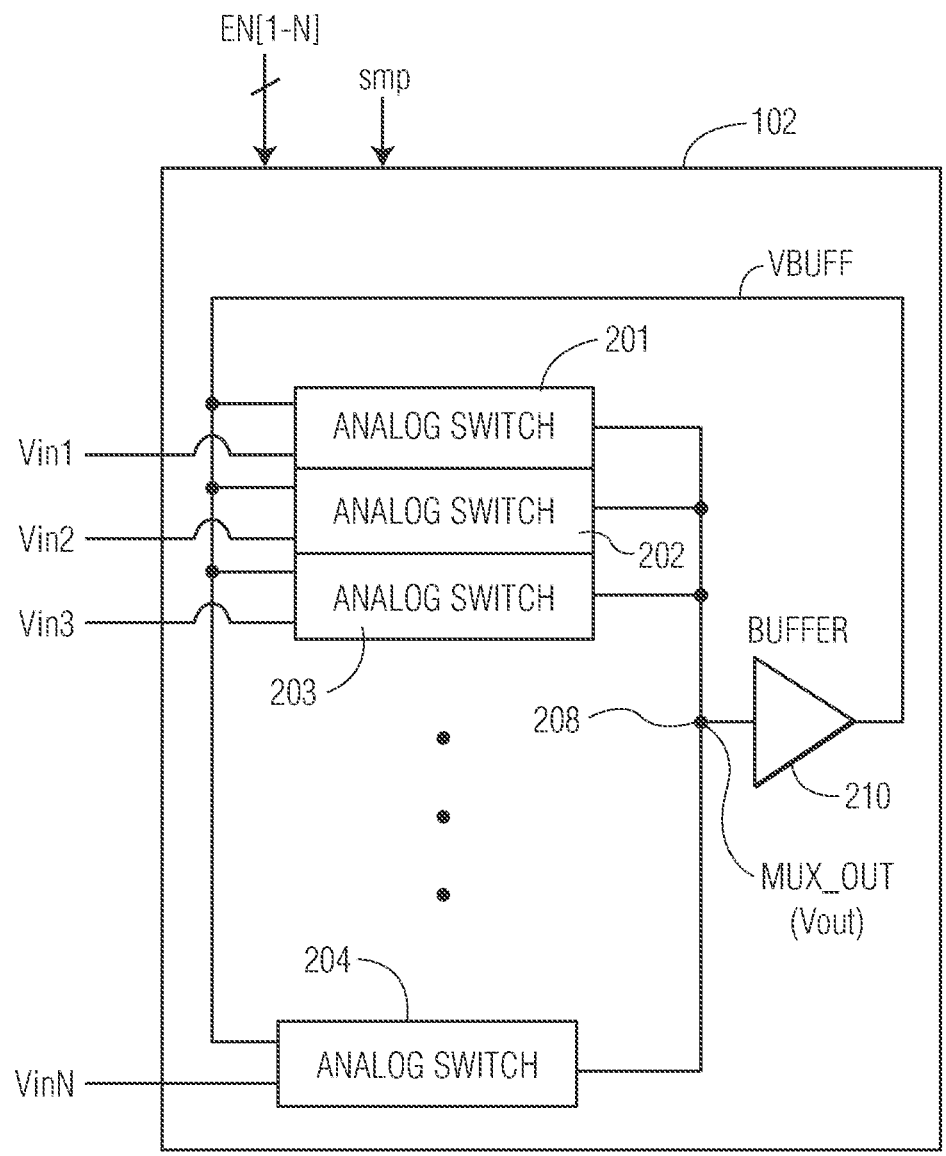
FIG. 2 illustrates, in block diagram form, a more detailed view of the analog MUX of FIG. 1, including multiple analog switches and a common buffer, in accordance with one embodiment of the present invention.

FIG. 2 illustrates, in block diagram form, a more detailed view of analog MUX 102, in accordance with one embodiment of the present invention. In the illustrated embodiment, MUX 102 includes N analog switches, 201-204, in which each analog switch includes a bootstrap circuit and a pass transistor. Each of the N analog switches is coupled to receive one corresponding input from the N input voltages, Vin1–VinN, one corresponding enable signal (EN) from enable signals EN[1–N], and the sample signal (smp). An output of each analog switch is connected to a common circuit node 208 which provides MUX_OUT to an input of a common buffer 210 (also referred to simply as buffer 210). Circuit node 208 is a common circuit node because outputs of all of analog switches 201-204 are connected to this same circuit node, and buffer 210 is a common buffer because all of analog switches 201-204 share the buffer. Buffer 210 provides a buffered MUX output voltage, VBUFF, as feedback to each of analog switches 210-204. Similarly, the buffered MUX output voltage is a common output voltage because the same buffered MUX output voltage is provided to all of analog switches 201-204. MUX_OUT corresponds to the output of analog MUX 102, and may also be referred to as Vout, which can be provided as an analog input to any circuit block, such as, e.g., ADC 100 of FIG. 1.

In operation, a buffered version of a selected one of input voltages Vin1–VinN is provided as feedback to all the bootstrap circuits of MUX 102. By using common buffer 210, only one shared buffer is needed in MUX 102 to provide a buffered version of any selected input voltage of the N possible input voltages. In this manner, each analog switch 201-204 does not need its own corresponding buffer, thus reducing the amount of circuit area needed for implementing analog MUX 102 while still reducing unwanted parasitics and leakage introduced by the bootstrap circuit within each analog switch.

Figure 3:
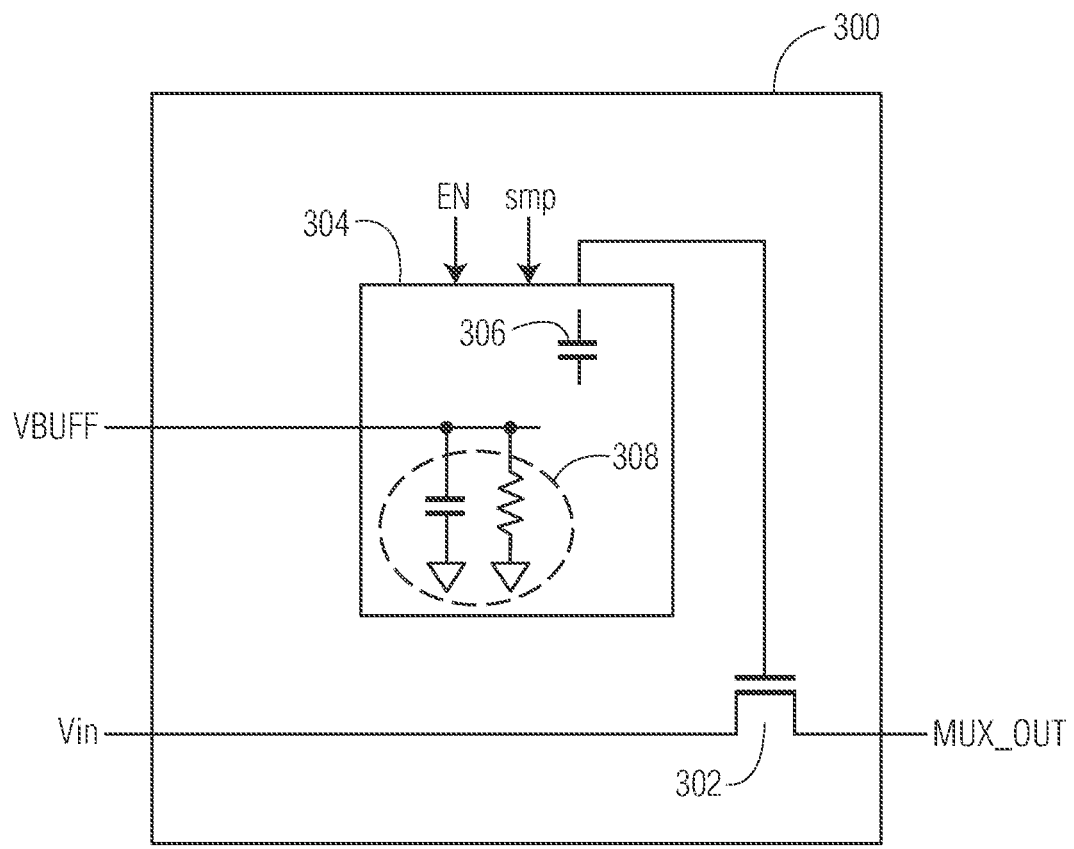
FIG. 3 illustrates, in schematic form, an analog switch of the analog MUX of FIG. 2, in accordance with one embodiment of the present invention.

FIG. 3 illustrates, in schematic form, a simplified view of an analog switch 300 which may be used to implement each of analog switches 201-204 of analog MUX 102, in accordance with one embodiment of the present invention. Analog switch 300 receives EN, smp, Vin, and VBUFF as inputs, in which Vin corresponds to a selected one of Vin1–VinN, and includes a pass transistor 302 and a bootstrap circuit 304. In the illustrated embodiment, pass transistor 302 is an n-type transistors. A first current electrode of pass transistor 302 is coupled to receive Vin, and a second current electrode of pass transistor 302 is coupled to provide MUX_OUT (at common circuit node 208). Bootstrap circuit 304 is coupled to receive VBUFF (from common buffer 210), EN, and smp, and has an output coupled to a control electrode (i.e. a gate electrode) of pass transistor 302. Bootstrap circuit 304 includes a boosting capacitor 306 and circuitry which uses EN and smp to control the precharging of boosting capacitor 306 and the application of the boosting charge from boosting capacitor 306 to the gate of the pass transistor. Note that in alternate embodiments, pass transistor 302 can be implemented as multiple transistors, such as multiple series-connected transistors, as will be seen, e.g., in reference to FIG. 6 below. Bootstrap circuit 304 may also include parasitic elements, represented by parasitic elements 308.

In operation, boosting capacitor 306 is precharged so that, when analog switch 300 is a selected analog switch of MUX 102 (while EN is asserted), the charge on the boost capacitor helps maintain a fairly constant gate-to-source voltage (Vgs) on the gate of the pass transistor for varying Vin voltages. In one embodiment, when not in the sample phase (e.g. while in the approximation phase), boosting capacitor 306 is precharged to the supply voltage (e.g. VDD), and upon entering the sample phase, the stored charge on boosting capacitor 306 is transferred to the gate of pass transistor 302 such that the gate of pass transistor 302 goes to Vin+VDD, which helps kick off the sample phase. In this manner, with the addition of the boosting charge, the Vgs of pass transistor 302 remains fairly independent of the input voltage. Note that, in this description, analog switch 300 represents the analog switch of analog switches 201-204 which is enabled (with its corresponding EN asserted) to provide the selected input voltage of Vin1-VinN as MUX_OUT. As will be described in more detail below in reference to FIG. 6, the corresponding EN in combination with smp are used to generate the appropriate sample signals for each analog switch to precharge the boosting capacitors and to properly apply the corresponding boosting charge to the pass gate transistor of the selected analog switch corresponding to the selected input voltage. Therefore, a selected input voltage of Vin1-VinN is provided as MUX_OUT at circuit node 208 by the corresponding selected (i.e. enabled) analog switch, and common buffer 210 provides the buffered selected input voltage as VBUFF back to switches 201-204.

The sample signal (smp) is also used by buffer 210 to control operation of buffer 210, as will be described in reference to FIG. 4. The sample signals, as used herein and abbreviated using "smp" in the signal name, are asserted (e.g. to a logic level high or logic level one) during the sample phases and negated (e.g. to a logic level low or logic level zero) during the approximation phases. The inverse of the sample signals, abbreviated using "smpb" in the signal name, are negated during the sample phases and asserted during the approximation phases. Note that the voltage of the logic level high for some of the smp signals may correspond to a lower supply voltage, e.g., Vdd_1p8=1.8V, while the voltage of the logic level high for other smp signals may correspond to a higher supply voltage, e.g., Vdd_3p3=3.3V. Therefore, in one embodiment, smp or smp_1p8 may correspond the lower supply voltage (in which the sample signal transitions between 0 and 1.8V), while smp_3p3 may correspond to the high supply voltage (in which the sample signal transitions between 0 and 3.3V). Also, in one embodiment, smp_1p8_to_3p3 corresponds to a sample signal which transitions between 1.8V as the logic level low and 3.3V as the logic level high, such that it is asserted to 3.3V, but negated to 1.8V. Therefore, any sample signal, and any inverse sample signal, can be generated at the appropriate voltage levels based on the received sample signal, smp.

In the illustrated embodiments, it is assumed that the devices (e.g. transistors) are rated at the low supply voltage level, e.g., 1.8V. This means that the maximum voltage supported on any two terminals of a device is 1.8V, in which higher voltages can damage the device. In the illustrated embodiments, it is also assumed that each input voltage to MUX 102, Vin1-VinN, can range from 0V to a higher (and possibly damaging) voltage. For example, in one embodiment, each of Vin1-VinN can range from 0V to twice the maximum voltage rating, e.g. 3.6V in the case of devices rated at 1.8V. (Note that, in one embodiment, the maximum limit of Vdd_3p3 is 3.6V.) As will be described in more detail in reference to FIG. 4, VBUFF tracks the selected input voltage (provided as MUX_OUT to the input of buffer 210), even as the selected input voltage rises above 1.8V to, e.g., 3.6V. In order to perform this tracking to the higher voltage level, an n-type transistor is connected as a source-follower (SF) (referred to as NSF), in which an SF drain control circuit controls the drain of the NSF as the selected input voltage (i.e. MUX_OUT) rises beyond 1.8V.

Figure 4:
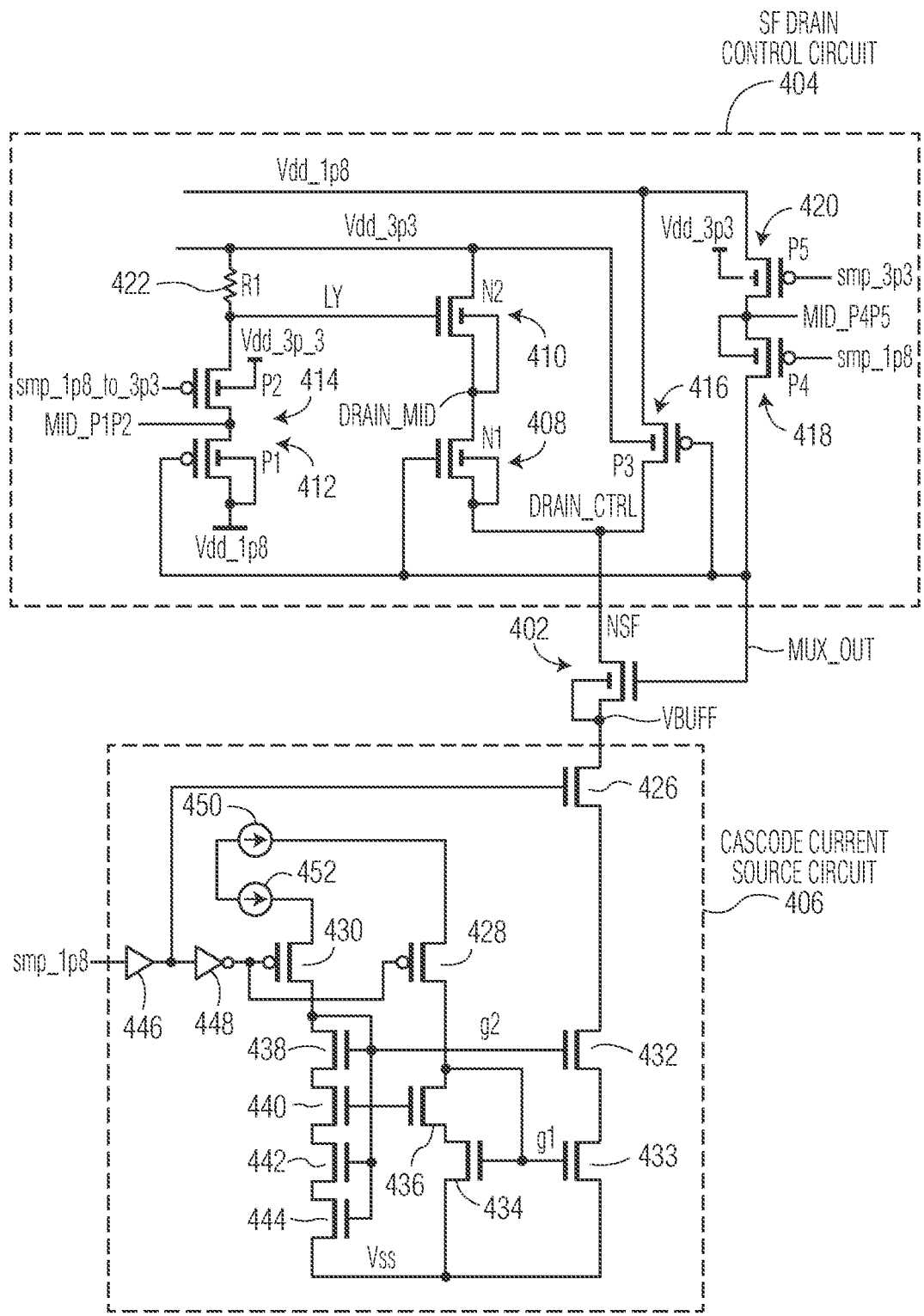
FIG. 4 illustrates, in schematic form, a more detailed view of the common buffer of FIG. 2, in accordance with one embodiment of the present invention.

FIG. 4 illustrates in partial schematic and partial block diagram form, a more detailed view of buffer 210, in accordance with one embodiment of the present invention. Buffer 210 includes NSF 402 (which may simply be referred to as NSF), an SF drain control circuit 404 coupled to a drain of NSF, and a cascode current source circuit 406 coupled to a source of NSF. A control electrode (i.e. gate) of NSF corresponds to the input of buffer 210, which is coupled to node 208 to receive MUX_OUT, and a body terminal of NSF is connected to a source of NSF which corresponds to the output of buffer 210 to provide VBUFF. SF drain control circuit 404 includes n-type transistors N1 408 and N2 410 (which may simply be referred to as N1 and N2, respectively), p-type transistors P1 412, P2 414, P3 416, P4 418, and P5 420 (which may simply be referred to as P1, P2, P3, P4, and P5, respectively), and a resistor R1 422 (which may simply be referred to as R1). SF drain control circuit 404 is also coupled to a first voltage supply node configured to provide a first voltage supply and a second voltage supply node configured to provide a second voltage supply, greater than the first voltage supply. In the illustrated embodiment, the first voltage supply is Vdd_1p8 and the second voltage supply is Vdd_3p3. Therefore, note that for ease of description, each of the first and second voltage supply nodes may be referred to as Vdd_1p8 and Vdd_3p3, respectively.

In SF drain control circuit 404, a circuit node at the drain of NSF is referred to as DRAIN_CTRL. A first terminal of R1, a first current electrode (e.g. drain) of N2, and body terminals of P2', P3, and P5 are coupled to Vdd_3p3. A body terminal of P1, a first current electrode (e.g. source) of P3, and a first current electrode (e.g. source) of P5 are coupled to Vdd_1p8. A first current electrode (e.g. source) of P4 is coupled to a second current electrode (e.g. drain) of P5, and a second current electrode (e.g. drain) of P4 is coupled to the control electrode of NSF (and therefore also coupled to receive MUX_OUT). A body terminal of P4 is coupled to the source of P4. A circuit node at the drain of P5 and source of P4 is referred to as MID_P4P5. A control electrode (e.g. gate) of P4 is coupled to receive sample signal smp_1p8, and a control electrode (e.g. gate) of P5 is coupled to receive sample signal smp_3p3.

Continuing with SF drain control circuit 404, a second current electrode (e.g. drain) of P3 is coupled to DRAIN_CTRL, a first current electrode (e.g. drain) of N1 is coupled to a second current electrode (e.g. source) of N2, and a second current electrode (e.g. source) of N1 is coupled to DRAIN_CTRL. A body terminal of N2 is coupled to the source of N2, and the circuit node at the source of N2 and drain of N1 is referred to as DRAIN MID. A body terminal of N1 is coupled to the source of N1 (at DRAIN_CTRL). A control electrode (e.g. gate) of P1, a control electrode (e.g. gate) of N1, and a control electrode (e.g. gate) of P3 are coupled to the gate of NSF (and thus are also coupled to receive MUX_OUT). A second terminal of R1 is coupled to a control electrode (e.g. gate) of N2, in which the circuit node at the second terminal of R1 and gate of N2 may be referred to as LY. A first current electrode (e.g. source) of P2 is coupled to the second terminal of R1 (at LY), a first current electrode (e.g. source) of P1 is coupled to a second current electrode (e.g. drain) of P2, and a second current electrode (e.g. drain) of P1 is coupled to Vdd_1p8. A circuit node at the drain of P2 and source of P1 is referred to as MID_P1P2. A control electrode (e.g. gate) of P2 is coupled to receive sample signal smp_1p8_to_3p3.

Cascode current source circuit 406, which provides a bias current at the source of NSF, includes p-type transistors 430 and 428 and n-type transistor 426, which all operate as switches. Cascode current source circuit 406 also includes n-type transistors 432 and 433, which operate as cascode current sources, and diode connected n-type transistors 438 and 434. Cascode current source circuit also includes n-type transistors 440, 442, 444, and 436, a buffer 446, an inverter 448, and current sources 450 and 452. A first current electrode of transistor 426 is coupled to the source of NSF and a second current electrode of transistor 426 is coupled to a first current electrode of transistor 432. A second current electrode of transistor 432 is coupled to a first current electrode of transistor 433, and a second current electrode of transistor 433 is coupled to a third voltage supply node configured to provide a third voltage supply, VSS, which is less than the first and second voltage supplies. In one embodiment, VSS is ground or 0V, and the third voltage supply node may simply be referred to as VSS. An input of buffer 446 is coupled to receive smp_1p8, and an output of buffer 446 is coupled to an input of inverter 448 and coupled to provide a buffered smp_1p8 to a control electrode of transistor 426. An output of inverter 448 is coupled to provide the inverse of smp_1p8 to control electrodes of transistors 430 and 428. First terminals of current sources 450 and 452 are coupled to each other, a second terminal of current source 450 is coupled to a first current electrode of transistor 428, and a second terminal of current source 452 is coupled to a first current electrode of transistor 430.

Still referring to cascode current source circuit 406, a second current electrode of transistor 430 is coupled to a first current electrode of transistor 438 and a control electrode of transistor 438. The control electrode of transistor 438 is coupled to a control electrode of transistor 432 at circuit node g2. A first current electrode of transistor 440 is coupled to a second current electrode of transistor 438, a first current electrode of transistor 442 is coupled to a second current electrode of transistor 440, a control electrode of transistor 442 is coupled to the control electrodes of transistors 438 and 432 at g2, a first current electrode of transistor 444 is coupled to a second current electrode of transistor 442, a second current electrode of transistor 444 is coupled to VSS, and a control electrode of transistor 444 is coupled to control electrodes of transistors 442, 438, and 432 at g2. A first current electrode of transistor 436 is coupled to a second current electrode of transistor 428 and a gate electrode of transistor 436 is coupled to a gate electrode of transistor 440. A first current electrode of transistor 434 is coupled to a second current electrode of transistor 436, a second current electrode of transistor 434 is coupled to VSS, and a control electrode of transistor 434 is coupled to the first current electrode of transistor 436 and a control electrode of transistor 433 at a circuit node g1.

In operation, buffer 210 operates during the sample phase such that VBUFF tracks the selected analog input voltage. In this manner, while MUX_OUT provides an input voltage selected by MUX 102 to ADC 100, buffer 210 provides a buffered version of the selected input voltage to the bootstrap circuits (e.g. 304) of MUX 102 to control the pass gates (e.g. 302) of MUX 102. During the approximation phase, when smp is negated (e.g. 0), buffer 210 is set up for the next sampling phase. With smp negated, P4 and P5 are on (e.g. conductive) so as to pull MUX_OUT to Vdd_1p8. DRAIN_CTRL is also pulled up to Vdd_1p8 through N1 (since MUX_OUT is pulled high) and N2 (since LY is at Vdd_3p3). Therefore, with both the gate and drain of NSF at Vdd_1p8, NSF operates as a source follower which also pre-charges VBUFF to Vdd_1p8. Recall that during the approximation phase (with smp negated), the boosting capacitor, e.g. 306, is also pre-charged to the supply voltage (Vdd_1p8, in the illustrated embodiment).

Upon entering the sample phase, the sample signals are asserted. When the sample signals, upon being asserted, start transitioning from 0 to their asserted voltage level (e.g. 1.8V or 3.3V), mux_vg (which corresponds to the gate voltage of the pass transistor, e.g., 302, of the corresponding bootstrap circuit) also starts transitioning from 0V to 1.8V to turn on the pass transistor which therefore drives MUX_OUT towards the selected input voltage (Vin=selected one of Vin1–VinN). Concurrently with these transitions, pre-charged VBUFF boosts the bottom plate of the boosting capacitor (e.g. 306) which in turn raises the top plate of the boosting capacitor which actually drives the pass transistor (e.g. 302). Therefore, as will be seen in more detail in reference to FIG. 6, VBUFF rather than Vin drives the boosting capacitor of the bootstrap circuit. Also, with smp asserted, P4 and P5 turn off (become non-conductive) and block the path between MUX_OUT and Vdd_1p8. This releases MUX_OUT, allowing MUX_OUT to be driven by the selected input voltage all the way up to 3.3V.

With smp asserted, the gate of P2 is at 3.3V. When MUX_OUT is driven up over 1.8V, P1 and P2 turn off and cut off the path between LY and VDD_1p8, releasing LY. This allows LY to be pulled up through R1 to Vdd_3p3. At this point, N1 and N2 allow VBUFF to continue to be pulled up, higher than 1.8V. For example, with LY pulled up to 3.3, the drain and gate of N2 are at 3.3. As MUX_OUT is pulled up towards 3.3V at the gate of N1, DRAIN_CTRL at the drain of NSF is also pulled by to 3.3V. In this manner, VBUFF continues to track MUX_OUT as MUX_OUT continues rising up through 1.8V to 3.3V. Therefore, SF drain control circuit 404 operates as a "switch over circuit" which allows the drain of NSF (DRAIN_CTRL) to switch over from 1.8V to 3.3V as Vin increases beyond 1.8V, allowing VBUFF at the source of NSF (i.e. the output of the NSF) to keep tracking Vin as Vin continues up beyond 1.8V. Note that VBUFF tracks Vin (and, likewise, MUX_OUT) but with a gate-source voltage drop due to NSF. However, this is sufficient to provide as feedback to trigger the bootstrap circuits, while MAX_OUT fully tracks Vin (as it is the output of MUX 102).

Also during the sample phase as VBUFF is tracking MUX_OUT, cascode current source circuit 406 provides a small bias current on the source of NSF. With smp asserted, the output of buffer 446 turns on transistor 426, and the output of inverter 448 turns on transistors 430 and 428 (each also referred to as a switch). Note that transistor 426 operates as both a switch and a protection device for when VBUFF is 1.8V or higher above the voltage of the gate or source of transistor 432. With transistors 430 and 428 on, a current from current source 452 is provided down through transistors 438, 440, 442, and 444 and a current from current source 450 is provided down through transistors 436 and 434. Transistors 438, 442, and 444 are diode connected resulting in a bias voltage at g2, and transistor 434 is diode connected resulting in a bias voltage at g1. This results in turning on cascoded current source transistors 432 and 433, providing a bias current from the source of NSF to VSS. This provides the required load current for functionality of the source follower.

Figure 5:
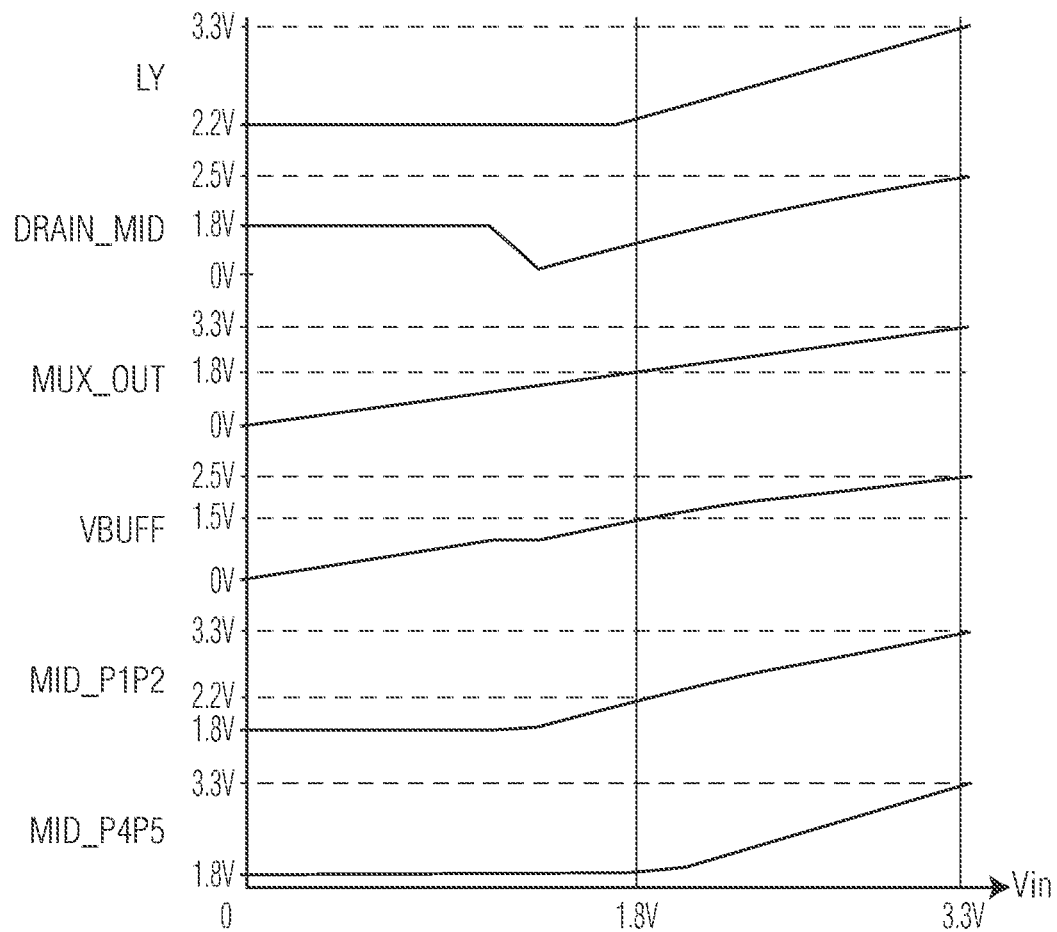
FIG. 5 illustrates waveforms of various signals of the common buffer of FIG. 4, in accordance with one embodiment of the present invention.

FIG. 5 illustrates waveforms of various signals of FIG. 4 in relation to the value of Vin (the selected input voltage), in accordance to one embodiment of the present invention. Note that the voltage values are approximate, primarily to illustrate the trends in the signals. For example, the top waveform corresponds to the voltage at node LY (on the Y-axis) as the input voltage increases from 0V to 3.3V (along the X-axis). It can be seen that LY increases from about 2.2V up to 3.3V. The second waveform from the top corresponds to the voltage at node DRAIN MID which begins at about 1.8V, drops as Vin increases to 1.8V, and then increases up to about 2.5V as Vin increases. The third waveform form the top corresponds to the voltage of MUX_OUT which begins at 0 when Vin is 0, is at about 1.8V when Vin is at 1.8, and then at about 3.3V when Vin reaches 3.3V, thus fully tracking Vin, as expected. The fourth waveform from the top corresponds to the voltage of VBUFF which tracks Vin but it is at a voltage drop below MUX_OUT due to NSF. Therefore, VBUFF begins at about 0V then increases to about 1.5V when Vin is at 1.8V, and then to about 2.5V when Vin is at 3.3V. The fifth and sixth waveforms correspond to the voltage at nodes MID_P1P2 and MID_P4P5, respectively, which increase from about 1.8V to 3.3V as Vin increases from 0 to 3.3V.

Figure 6:
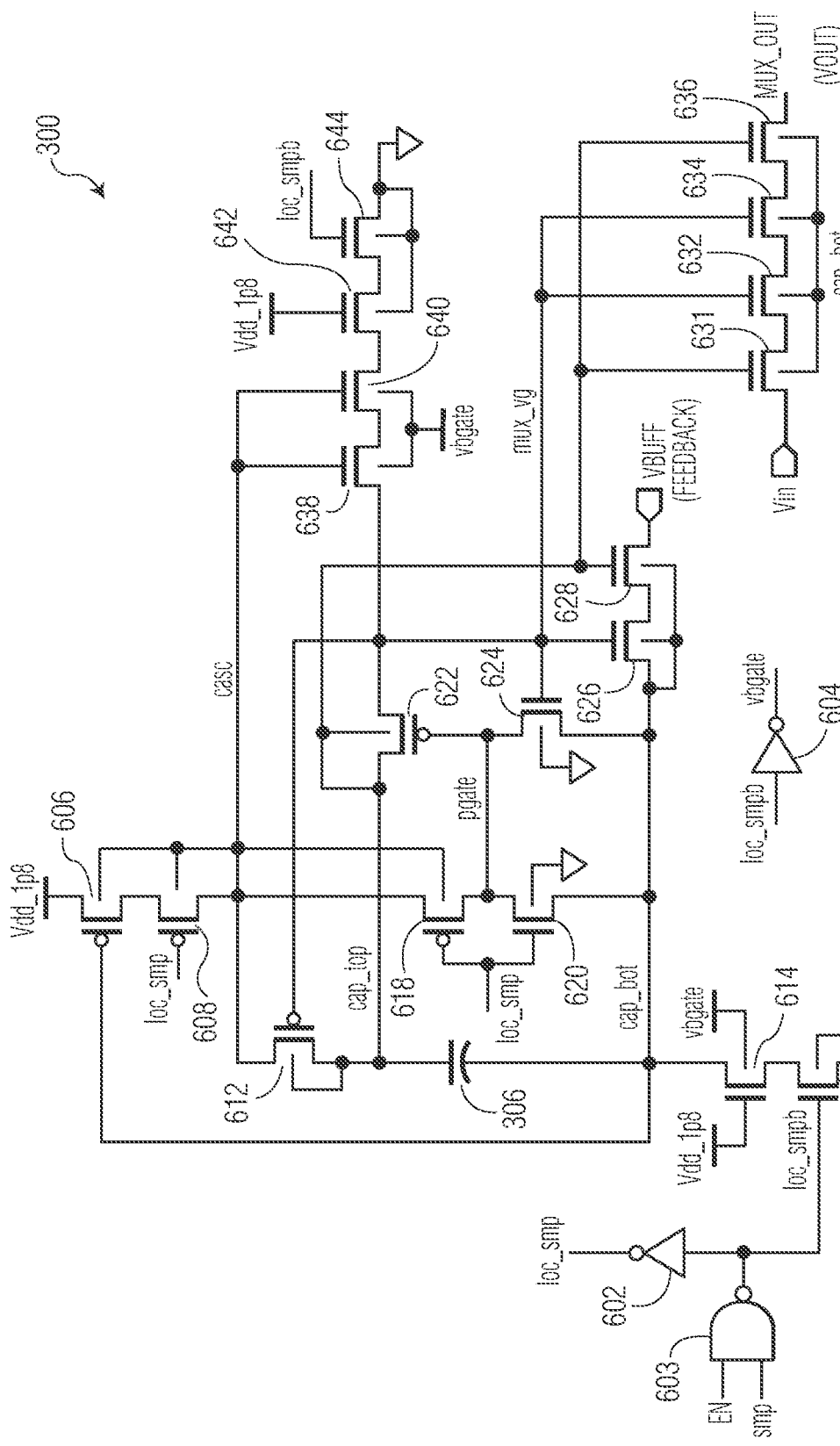
FIG. 6 illustrates, in schematic form, a more detailed view of the analog switch of FIG. 2, in accordance with one embodiment of the present invention.

FIG. 6 illustrates, in partial block diagram and partial schematic form, a more detailed view of analog switch 300, in accordance with one embodiment of the present invention, including bootstrap circuit 304 and pass transistor 302. Bootstrap circuit 304 is implemented with p-type transistors 606, 608, 618, and 622, n-type transistors 620, 624, 626, 628, 638, 640, 642, 644, 614, and 616, inverters 602 and 604, and a NAND gate 603, and pass transistor 302 is implemented with n-type transistors 630, 632, 634, and 636. NAND gate 603 has a first input coupled to receive the corresponding enable signal (EN) and a second input coupled to receive smp. An output of NAND gate 603 is coupled to an input of inverter 602. Inverter 602 provides a local sample signal, loc_smp, at its output. NAND gate 603 provides loc_smpb at its output, which corresponds to the inverse of loc_smp. Inverter 604 receives loc_smpb at an input and provides vbgate at its output. The local sample signals, loc_smp and loc_smpb, are local to analog switch 300, while smp is received by all analog switches (and thus may be referred to as the global sample signal). The local sample signals are generated based on EN and smp. For example, loc_smp is only asserted when smp as well as the corresponding EN of the particular analog switch are asserted (e.g. when the Vin of the particular analog switch is selected by EN[1-7]). As seen in the illustrated embodiment, when EN is asserted, loc_smp follows smp, but when EN is negated, loc_smp remains at a logic level low regardless of the value of smp. With the logic of NAND gate 603 and inverter 602, when smp is negated, loc_smp is also negated, regardless of the value of EN. Note that, in alternate embodiments, the circuitry used for generating loc_smp and loc_smpb can be any combination of gates or circuitry to produce the desired functionality of loc_smp and loc_smpb based on smp.

Continuing with FIG. 6, a top plate of boosting capacitor 306 is coupled to a circuit node labeled cap_top (and therefore refers to the voltage on the top plate of capacitor 306), and a bottom plate of boosting capacitor 306 is coupled to a circuit node labeled cap_bot (and therefore refers to the voltage on the bottom plate of capacitor 306). A first current electrode of transistor 606 is coupled to Vdd_1p_8, a control electrode of transistor 606 is coupled to cap_bot, a first current electrode of transistor 608 is coupled to a second current electrode of transistor 606, and a control electrode of transistor 608 is coupled to receive loc_smp. A second electrode of transistor 608 is coupled to a circuit node labeled casc and is therefore also coupled to a first current electrode of each of transistor 612, transistor 618, transistor 638, and transistor 640. A second current electrode is coupled to cap_top and to a body terminal of transistor 612. A first current electrode of transistor 622 is coupled to cap_top, a second current electrode of transistor 622 is coupled to a first current electrode of transistor 638 at a circuit node labeled mux_vg. A second current electrode of transistor 638 is coupled to a first current electrode of transistor 640, a second current electrode of transistor 640 is coupled to a first current electrode of transistor 642, a second current electrode of transistor 642 is coupled to a first current electrode of transistor 644, and a second current electrode of transistor 644 is coupled to VSS. Body terminals of transistors 638 and 640 are coupled to receive vbgate. A control electrode of transistor 642 is coupled to Vdd_1p8, and a control electrode of transistor 644 is coupled to receive loc_smpb.

Still referring to connectivity of FIG. 6, a first current electrode of transistor 618 is coupled to the second current electrode of transistor 608 at casc, a first current electrode of transistor 620 is coupled to a second current electrode of transistor 618 at a circuit node labeled pgate, a second current electrode of transistor 620 is coupled to cap_bot, and control electrodes of transistors 618 and 620 are coupled to receive loc_smp. A body terminal of transistor 622, a control electrode of transistor 628, and control electrodes of transistors 630 and 636 are coupled to cap_top. A control electrode of transistor 622 is coupled to a first current electrode of transistor 624 at node pgate, and is therefore also coupled to the second current electrode of transistor 618 and the first current electrode of transistor 620. A control electrode of transistor 612 is coupled to control electrodes of transistors 624, 626, 632, and 634 at mux_vg. A first current electrode of transistor 626 is coupled to cap_bot, a second current electrode of transistor 626 is coupled to a first current electrode of transistor 628, and a second current electrode 628 is coupled to receive VBUFF (and is therefore a first input of bootstrap circuit 304). A first current electrode of transistor 630 is coupled to receive the selected input voltage as Vin (and is therefore a second input of analog switch 300). A first current electrode of transistor 632 is coupled to a second current electrode of transistor 630, a second current electrode of transistor 634 is coupled to a second current electrode of transistor 632, a first current electrode of transistor 636 is coupled to a second current electrode of transistor 634, and a second current electrode of transistor 636 is coupled to provide MUX_OUT (i.e. Vout).

Still referring to connectivity of FIG. 6, body terminals of transistors 640 and 642 are coupled to VSS, body terminals of transistors 626, 628, 630, 632, 634, and 636 are coupled to cap_bot. Body terminals of transistors 606, 608, and 618 are coupled to casc. A first current electrode of transistor 614 is coupled to cap_bot, a control electrode of transistor 614 is coupled to Vdd_1p8, a body terminal of transistor 614 is coupled to receive vbgate, and a second current electrode of transistor 614 is coupled to a first current electrode of transistor 616. A control electrode of transistor 616 is coupled to receive loc_smpb from NAND gate 603, and a second current electrode and body terminal of transistor 616 are coupled to VSS.

In operation, analog switch 300 includes a first input to receive VBUFF and a second input to receive Vin, in which VBUFF is provided to series-connected transistors 626 and 628 to drive cap_bot while Vin is provided to series-connected transistors 630, 632, 634, and 636 (which operate as pass transistor 302) to drive MUX_OUT. Therefore, as described above, Vin is not used to drive boosting capacitor 306, instead the boosting capacitor is driven by VBUFF feedback from shared buffer 210 (when transistors 626 and 628 are turned on, i.e. enabled). As also described above, during the approximation phase (when smp and thus loc_smp are negated to 0), transistors 606, 608, and 612 pull cap_top to 1.8V while transistors 614 and 616 pull cap_bot to 0, thus pre-charging boosting capacitor 306 to 1.8V. During the sample phase (assuming analog switch 300 is enabled by the assertion of EN such that loc_smp=smp), cap_top and cap_bot are released, and cap_bot is driven by VBUFF (and not Vin) and cap_top turns on transistors 628, 630, and 636. As smp (and thus loc_smp) transitions from 0 to 1.8V, pgate turns on transistor 622, thus transitioning mux_vg to 1.8V as well, turning on transistors 626, 632, and 634. (Note that with loc_smpb=0, transistor 644 releases mux_vg from being pulled to ground and transistor 616 releases cap_bot from ground.) With transistors 630, 632, 634, and 634 turned on, Vin drives MUX_OUT, and with boosting capacitor 306 (driven by VBUFF via transistors 626 and 628) boosting mux_vg (beyond 1.8V), mux_vg can be maintained as fairly constant. Further, by cascading transistors 626 and 628 and transistors 630, 632, 634, and 636, these low voltage devices (rated, in one embodiment, at only 1.8V) can be protected from experiencing overvoltage conditions.

Note that, in the illustrated embodiment, the nodes labeled casc, pgate, and cap_top vary in voltage between 1.8V and 3.6V, the nodes labeled cap_bot varies in voltage between 0 and 3.6V. However, the node labeled mux_vg varies in voltage between 0 and 5.4V. The remaining nodes vary in voltage between 0 and 1.8V. In this manner, while boosting capacitor 306 can boost mux_vg up to 5.4V, the use of cascaded transistors, such as transistors 632 and 634, protect the low voltage devices.

In one embodiment, transistors 626 and 628 can be referred to collectively as a feedback enable transistor which, when turned on, allow VBUFF to be provided to the bottom plate of capacitor 306 so as to drive capacitor 306. Therefore, during sampling, the feedback enable transistor enables the feedback voltage from common buffer 210 to drive boosting capacitor 306. In other embodiments, the feedback enable transistor may be implemented using any number of transistors, such as one or more series-connected transistors.

Therefore, by now it can be appreciated how a single shared buffer can be shared among the analog switches of an analog MUX by providing the output of the shared buffer as feedback to drive the boosting capacitor within each analog switch. In this manner, a buffered version of the selected input voltage can be provided as feedback to each analog switch without the need to add a buffer to the input or output of each analog switch, while the selected input voltage can be used to drive the output of the analog MUX. This may result in reduced circuit area, and thus reduced cost, while still allowing input voltage capabilities which surpass the voltage ratings of the devices available in the process. The use of a shared buffer also helps maintain reduced circuit area and cost, even as the number of inputs to the analog MUX increases, since a buffer is not required for each input (i.e. each input channel). Also, in one embodiment, by coupling the output of the shared buffer to the boosting capacitor of the selected analog switch to drive the boosting capacitor during sampling, rather than coupling the selected input voltage itself to drive the boosting capacitor, unwanted parasitics and leakage may be avoided.

Note that, as used herein, the term "coupled," is not intended to be limited to a direct coupling or a mechanical coupling. However, in referring to any of the circuit elements herein, any coupled circuit elements may be, in some embodiments, "directly connected" in which there are no intervening circuit elements. For example, while the second terminal of R1 is described as coupled to the gate of N2, in one or more embodiments, the second terminal of R1 is directly connected to gate of N2.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or a "b" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Some of the above embodiments, as applicable, may be implemented using a variety of different information processing systems. For example, although FIG. 1 and the discussion thereof describe an exemplary information processing architecture, such as including a SAR ADC, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Also for example, in one embodiment, the illustrated elements of FIG. 1 are circuitry located on a single integrated circuit or within a same device. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the provision of the sample signals to the analog switches and shared buffer can be done in different ways, using different decoding or voltage swings, as needed. Furthermore, different circuitry requiring an analog input provided by an analog MUX can be used rather than the illustrated ADC. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit (IC) includes a plurality of analog inputs; and an analog multiplexer (MUX). The analog MUX includes a common output node configured to provide a MUX output; a plurality of analog switches, each switch including a corresponding bootstrap circuit coupled to a control electrode of a corresponding pass transistor, the corresponding bootstrap circuit including a corresponding boosting capacitor, wherein each analog switch of the plurality of analog switches has a first input coupled to a corresponding analog input of the plurality of analog inputs, a second input, and an output coupled to the common output node; and a shared buffer having an input coupled to the common output node and coupled to provide a common buffered MUX output to the second input of each of the plurality of analog switches. In one aspect of this embodiment, the first input of each of the plurality of analog switches is coupled to a first current electrode of the corresponding pass transistor, the output of each of the plurality of analog switches is coupled to a second current electrode of the corresponding pass transistor, and the second input of each of the plurality of analog switches is coupled to a first plate of the corresponding boosting capacitor. In a further aspect, the first plate of the each of the boosting capacitors of the plurality of analog switches is coupled to selectively receive the buffered MUX output via a corresponding feedback enable transistor, and a second plate of each of the boosting capacitors is coupled to the control electrode of the corresponding pass transistor. In a further aspect, during a sampling phase, the buffered MUX output drives a selected boosting capacitor via the corresponding feedback enable transistor of a selected analog switch of the plurality of analog switches. In yet a further aspect, prior to the sampling phase, the corresponding bootstrap circuit of each of the plurality of analog switches precharges the corresponding boosting capacitor. In another aspect of this embodiment, the IC further includes an analog-to-digital converter (ADC) having an input coupled to the MUX output. In another aspect, each of the plurality of analog inputs are configured to receive a voltage swing that is greater than a maximum voltage rating of transistors in the analog MUX. In a further aspect, the voltage swing is twice the maximum voltage rating. In yet another aspect, the shared buffer includes a source follower (SF) transistor having a gate electrode coupled to the MUX output, a source coupled to provide the buffered MUX output, and a drain coupled to an SF drain control circuit. In a further aspect, the SF drain control circuit includes a first p-type transistor coupled between a first voltage supply node and the drain of the SF transistor, and having a gate electrode coupled to the gate electrode of the SF transistor; a first n-type transistor having a drain coupled to a second voltage supply node, a gate electrode coupled to the second voltage supply node via a resistive element, and a source; and a second n-type transistor coupled between the source of the first n-type transistor and the drain of the SF transistor, and having a gate electrode coupled to the gate electrode of the SF transistor, wherein the first voltage supply node is configured to supply a first voltage supply greater than zero, and the second voltage supply node is configured to supply a second voltage supply, greater than the first voltage supply. In a further aspect, the shared buffer further includes a cascode current source circuit coupled between the source of the SF and a third voltage supply node configured to provide a third voltage supply than is less than the first voltage supply. In yet a further aspect, the SF drain control circuit further includes a second p-type transistor coupled between the first voltage supply node and the gate electrode of the SF transistor; and a third p-type transistor coupled between a gate electrode of the first n-type transistor and the first voltage supply node. In yet an even further aspect, the SF drain control circuit further includes a fourth p-type transistor coupled between a drain of the second p-type transistor and the gate electrode of the SF transistor, wherein a gate electrode of the fourth p-type transistor is coupled to receive a first sample signal which is asserted to the first voltage supply during a sampling phase of the analog MUX, and a gate electrode of the second p-type transistor is coupled to receive a second sample signal which is asserted to the second voltage supply during the sampling phase; and a fifth p-type transistor coupled between the gate electrode of the first n-type transistor and a source of the third p-type transistor, wherein a gate electrode of the third p-type transistor is coupled to the gate electrode of the SF transistor, and a gate electrode of the fifth p-type transistor is coupled to receive a third sample signal which is asserted to the second voltage supply during the sampling phase.

In another embodiment, an integrated circuit (IC) includes a plurality of analog inputs; and an analog multiplexer (MUX) which includes a common output node configured to provide a MUX output; a plurality of analog switches, each switch including a corresponding boosting capacitor coupled to a control electrode of a corresponding pass transistor, wherein each analog switch of the plurality of analog switches has a first input coupled to a corresponding analog input of the plurality of analog inputs, a second input, and an output coupled to the common output node; and a shared buffer comprising a source follower (SF) transistor having drain coupled to a drain control circuit, a gate electrode coupled to the common output node, and a source configured to provide a common feedback voltage to the second input of each of the plurality of analog switches, wherein the drain control circuit is configured to switch a voltage on the drain of the SF transistor from a first supply voltage to a higher supply voltage as a selected analog input of the plurality of analog inputs increases beyond the first supply voltage. In one aspect, during a sampling phase, the feedback voltage drives a selected boosting capacitor of a selected analog switch of the plurality of switches corresponding to the selected analog input. In a further aspect, during the sampling phase, a voltage on the selected analog input drives the MUX output. In another aspect, prior to the sampling phase, a corresponding bootstrap circuit of each of the plurality of analog switches is configured to precharge the corresponding boosting capacitor. In another aspect, prior to the sampling phase, the drain control circuit is configured to precharge the common output node to the first supply voltage. In yet a further aspect, during the sampling phase, a voltage on the selected analog input does not drive the selected boosting capacitor of the selected analog switch of the plurality of analog switches corresponding to the selected analog input.

In yet another embodiment, an analog multiplexer (MUX) includes a plurality of analog inputs; a common output node configured to provide a selected analog input of the plurality of analog inputs as a MUX output; a plurality of analog switches, each switch including a corresponding boosting capacitor coupled to a control electrode of a corresponding pass transistor, wherein each analog switch of the plurality of analog switches has a first input coupled to receive a corresponding analog input of the plurality of analog inputs, a second input, a third input to receive a corresponding enable signal, and an output coupled to the common output node; and a shared buffer. The shared buffer includes a source follower (SF) transistor having a gate electrode coupled to the common output node, and a source coupled to a body terminal of the SF transistor and configured to provide a common feedback voltage to the second input of each of the plurality of analog switches; and a drain control circuit coupled to a drain of the SF transistor. The drain control circuit includes a first p-type transistor coupled between a first voltage supply node and the drain of the SF transistor, and having a gate electrode coupled to the gate electrode of the SF transistor; a first n-type transistor having a drain coupled to a second voltage supply node, a gate electrode coupled to the second voltage supply node via a resistive element, and a source; and a second n-type transistor coupled between the source of the first n-type transistor and the drain of the SF transistor, and having a gate electrode coupled to the gate electrode of the SF transistor, wherein the first voltage supply node is configured to supply a first voltage supply greater than zero, and the second voltage supply node is configured to supply a second voltage supply, greater than the first voltage supply.

What is claimed is:

1. An integrated circuit (IC) comprising:
   a plurality of analog inputs; and
   an analog multiplexer (MUX) comprising:
   a common output node configured to provide a MUX output;
   a plurality of analog switches, each switch including a corresponding bootstrap circuit coupled to a control electrode of a corresponding pass transistor, the corresponding bootstrap circuit including a corresponding boosting capacitor, wherein each analog switch of the plurality of analog switches has a first input coupled to a corresponding analog input of the plurality of analog inputs, a second input, and an output coupled to the common output node; and
   a shared buffer having an input coupled to the common output node and coupled to provide a common buffered MUX output to the second input of each of the plurality of analog switches.

2. The integrated circuit of claim 1, wherein the first input of each of the plurality of analog switches is coupled to a first current electrode of the corresponding pass transistor, the output of each of the plurality of analog switches is coupled to a second current electrode of the corresponding pass transistor, and the second input of each of the plurality of analog switches is coupled to a first plate of the corresponding boosting capacitor.

3. The integrated circuit of claim 2, wherein the first plate of the each of the boosting capacitors of the plurality of analog switches is coupled to selectively receive the buffered MUX output via a corresponding feedback enable transistor, and a second plate of each of the boosting capacitors is coupled to the control electrode of the corresponding pass transistor.

4. The integrated circuit of claim 3, wherein, during a sampling phase, the buffered MUX output drives a selected boosting capacitor via the corresponding feedback enable transistor of a selected analog switch of the plurality of analog switches.

5. The integrated circuit of claim 4, wherein, prior to the sampling phase, the corresponding bootstrap circuit of each of the plurality of analog switches precharges the corresponding boosting capacitor.

6. The integrated circuit of claim 1, further comprising an analog-to-digital converter (ADC) having an input coupled to the MUX output.

7. The integrated circuit of claim 1, wherein each of the plurality of analog inputs are configured to receive a voltage swing that is greater than a maximum voltage rating of transistors in the analog MUX.

8. The integrated circuit of claim 7, wherein the voltage swing is twice the maximum voltage rating.

9. The integrated circuit of claim 1, wherein the shared buffer comprises:
   a source follower (SF) transistor having a gate electrode coupled to the MUX output, a source coupled to provide the buffered MUX output, and a drain coupled to an SF drain control circuit.

10. The integrated circuit of claim 9, wherein the SF drain control circuit comprises:
    a first p-type transistor coupled between a first voltage supply node and the drain of the SF transistor, and having a gate electrode coupled to the gate electrode of the SF transistor;
    a first n-type transistor having a drain coupled to a second voltage supply node, a gate electrode coupled to the second voltage supply node via a resistive element, and a source; and
    a second n-type transistor coupled between the source of the first n-type transistor and the drain of the SF transistor, and having a gate electrode coupled to the gate electrode of the SF transistor,
    wherein the first voltage supply node is configured to supply a first voltage supply greater than zero, and the second voltage supply node is configured to supply a second voltage supply, greater than the first voltage supply.

11. The integrated circuit of claim 10, wherein the shared buffer further comprises a cascode current source circuit coupled between the source of the SF and a third voltage supply node configured to provide a third voltage supply than is less than the first voltage supply.

12. The integrated circuit of claim 11, wherein the SF drain control circuit further comprises:
    a second p-type transistor coupled between the first voltage supply node and the gate electrode of the SF transistor; and a third p-type transistor coupled between a gate electrode of the first n-type transistor and the first voltage supply node.

13. The integrated circuit of claim 12, wherein the SF drain control circuit further comprises:
   a fourth p-type transistor coupled between a drain of the second p-type transistor and the gate electrode of the SF transistor, wherein a gate electrode of the fourth p-type transistor is coupled to receive a first sample signal which is asserted to the first voltage supply during a sampling phase of the analog MUX, and a gate electrode of the second p-type transistor is coupled to receive a second sample signal which is asserted to the second voltage supply during the sampling phase; and
   a fifth p-type transistor coupled between the gate electrode of the first n-type transistor and a source of the third p-type transistor, wherein a gate electrode of the third p-type transistor is coupled to the gate electrode of the SF transistor, and a gate electrode of the fifth p-type transistor is coupled to receive a third sample signal which is asserted to the second voltage supply during the sampling phase.

14. An integrated circuit comprising:
   a plurality of analog inputs; and
   an analog multiplexer (MUX) comprising:
      a common output node configured to provide a MUX output;
      a plurality of analog switches, each switch including a corresponding boosting capacitor coupled to a control electrode of a corresponding pass transistor, wherein each analog switch of the plurality of analog switches has a first input coupled to a corresponding analog input of the plurality of analog inputs, a second input, and an output coupled to the common output node; and
      a shared buffer comprising a source follower (SF) transistor having drain coupled to a drain control circuit, a gate electrode coupled to the common output node, and a source configured to provide a common feedback voltage to the second input of each of the plurality of analog switches, wherein the drain control circuit is configured to switch a voltage on the drain of the SF transistor from a first supply voltage to a higher supply voltage as a selected analog input of the plurality of analog inputs increases beyond the first supply voltage.

15. The integrated circuit of claim 14, wherein, during a sampling phase, the feedback voltage drives a selected boosting capacitor of a selected analog switch of the plurality of switches corresponding to the selected analog input.

16. The integrated circuit of claim 15, wherein during the sampling phase, a voltage on the selected analog input drives the MUX output.

17. The integrated circuit of claim 15, wherein, prior to the sampling phase, a corresponding bootstrap circuit of each of the plurality of analog switches is configured to precharge the corresponding boosting capacitor.

18. The integrated circuit of claim 15, wherein, prior to the sampling phase, the drain control circuit is configured to precharge the common output node to the first supply voltage.

19. The integrated circuit of claim 18, wherein during the sampling phase, a voltage on the selected analog input does not drive the selected boosting capacitor of the selected analog switch of the plurality of analog switches corresponding to the selected analog input.

20. An analog multiplexer (MUX) comprising:
   a plurality of analog inputs;
   a common output node configured to provide a selected analog input of the plurality of analog inputs as a MUX output;
   a plurality of analog switches, each switch including a corresponding boosting capacitor coupled to a control electrode of a corresponding pass transistor, wherein each analog switch of the plurality of analog switches has a first input coupled to receive a corresponding analog input of the plurality of analog inputs, a second input, a third input to receive a corresponding enable signal, and an output coupled to the common output node; and
   a shared buffer comprising:
      a source follower (SF) transistor having a gate electrode coupled to the common output node, and a source coupled to a body terminal of the SF transistor and configured to provide a common feedback voltage to the second input of each of the plurality of analog switches; and
      a drain control circuit coupled to a drain of the SF transistor and comprising:
         a first p-type transistor coupled between a first voltage supply node and the drain of the SF transistor, and having a gate electrode coupled to the gate electrode of the SF transistor;
         a first n-type transistor having a drain coupled to a second voltage supply node, a gate electrode coupled to the second voltage supply node via a resistive element, and a source; and
         a second n-type transistor coupled between the source of the first n-type transistor and the drain of the SF transistor, and having a gate electrode coupled to the gate electrode of the SF transistor, wherein the first voltage supply node is configured to supply a first voltage supply greater than zero, and the second voltage supply node is configured to supply a second voltage supply, greater than the first voltage supply.

\* \* \* \* \*